(12) United States Patent
Kim et al.

(10) Patent No.: US 9,287,463 B2
(45) Date of Patent: Mar. 15, 2016

(54) METHOD OF MANUFACTURING A LIGHT GENERATING DEVICE AND LIGHT GENERATING DEVICE MANUFACTURED THROUGH THE SAME

(71) Applicant: Intellectual Discovery Co., Ltd., Seoul (KR)

(72) Inventors: Tae-Geun Kim, Seongnam-si (KR); Jae-Hoon Lee, Seoul (KR)

(73) Assignee: INTELLECTUAL DISCOVERY CO., LTD., Seoul (KR)

( * ) Notice: Subject to any disclaimer, the term of this patent is extended or adjusted under 35 U.S.C. 154(b) by 0 days.

(21) Appl. No.: 14/224,847

(22) Filed: Mar. 25, 2014

(65) Prior Publication Data
US 2014/0284653 A1 Sep. 25, 2014

(30) Foreign Application Priority Data
Mar. 25, 2013 (KR) .......................... 10-2013-0031245

(51) Int. Cl.
*H01L 33/44* (2010.01)
*H01L 33/00* (2010.01)
*H01L 33/22* (2010.01)

(52) U.S. Cl.
CPC ............ *H01L 33/44* (2013.01); *H01L 33/0091* (2013.01); *H01L 33/22* (2013.01); *H01L 2933/0025* (2013.01)

(58) Field of Classification Search
CPC ........................................................ H01L 33/44
USPC ....................................... 257/99, 98, 48, 9, 13
See application file for complete search history.

(56) References Cited

U.S. PATENT DOCUMENTS

2012/0141799 A1* 6/2012 Kub et al. .................... 428/408

* cited by examiner

*Primary Examiner* — Chuong A Luu
*Assistant Examiner* — Rodolfo Fortich
(74) *Attorney, Agent, or Firm* — Rothwell, Figg, Ernst & Manbeck

(57) ABSTRACT

A method of manufacturing a light generating device and a light generating device manufactured through the method are disclosed. The method of manufacturing a light generating device according to an exemplary embodiment of the present invention, includes preparing a semiconductor stacking structure including a p-type semiconductor layer, an n-type semiconductor layer and an active layer disposed between the p-type semiconductor layer and the n-type semiconductor layer; forming a metal thin film on the n-type semiconductor layer or on the p-type semiconductor layer; annealing the metal thin film to form a grain boundary at the metal thin film; applying liquid with graphite powder to the metal thin film with the grain boundary; thermally treating the semiconductor stacking structure to which the liquid with graphite powder is applied; and removing the metal thin film with the grain boundary.

7 Claims, 5 Drawing Sheets

METHOD OF MANUFACTURING A LIGHT GENERATING DEVICE AND LIGHT GENERATING DEVICE MANUFACTURED THROUGH THE SAME

CROSS REFERENCE TO RELATED APPLICATION

This application claims priority from and the benefit of Korean Patent Application No. 10-2013-0031245 filed on Mar. 25, 2013, which is hereby incorporated by reference for all purposes as if fully set forth herein.

BACKGROUND OF THE INVENTION

1. Field of the Invention

The present invention relates to a method of manufacturing a light generating device and a light generating device manufactured through the method, more specifically to a method of manufacturing a semiconductor light generating device and a light generating device manufactured through the method.

2. Discussion of the Background

In general, a light generating device such as a light emitting diode (LED) has merits such as high efficiency, long lifetime, a low power consumption, eco friendliness, etc., so that the light generating device is employed in various fields.

The light generating device may be divided into two types of a lateral type and a vertical type according to a shape. According to the lateral type light generating device, an n-type semiconductor layer is formed on a substrate, and a quantum well layer (or active layer) and a p-type semiconductor layer are formed in sequence. Then, a portion of the p-type semiconductor layer and the quantum well layer is removed to expose the n-type semiconductor layer, and a p-type electrode is formed on the p-type semiconductor layer and an n-type electrode is formed on an exposed region of the n-type semiconductor layer.

The vertical type LED (or VLED) has merits such as effective heat dissipation, high electro optical characteristics to appeal, but still it is essential to enhance to light extracting efficiency for high efficiency VLED for a lighting apparatus.

The external quantum efficiency of LED is determined by multiplying internal quantum efficiency with light extracting efficiency, and the internal quantum efficiency is determined by current injection efficiency. Therefore, in order to enhance efficiency of LED, effective current distribution from an electrode to a semiconductor layer and effective injection of carrier to a quantum well layer are required.

FIG. 1 is a cross-sectional view showing a conventional light generating device.

Referring to FIG. 1, the conventional light generating device 100 includes a p-type electrode 120 formed on a substrate 110 of metal, a semiconductor stacking structure 130 formed on the p-type electrode 120, a graphene layer 140 formed on the semiconductor stacking structure 130 and an n-type electrode 150 formed on the graphene layer 140. The semiconductor stacking structure 130 includes a p-type semiconductor layer 131, an n-type semiconductor structure 133 and an active layer 132 disposed between the p-type semiconductor layer 131 and the n-type semiconductor structure 133.

When a plus voltage is applied to the substrate 110 and a minus voltage is applied to the n-type electrode 150, the light generating device 110 operates.

In this case, the currents applied to the n-type electrode 150 is distributed uniformly through the graphene layer 140 so that electrons are applied to the active layer 132, and the p-type semiconductor layer 131 provides the active layer 132 with holes so that holes combine with the electrons to generate light. In order to uniformly distribute current to the n-type semiconductor layer 133, ITO, which is optically transparent and electrically conductive, is previously used but graphene that is superior to ITO in electrical and optical characteristics is developed and applied to the light generating device 100.

FIG. 2A through FIG. 2E are cross-sectional views showing a process of manufacturing the conventional light generating device in FIG. 1.

In order to manufacture the light generating device 100 in FIG. 1, a metal thin film M including nickel (Ni) or copper (Cu) is formed on a silicon oxide ($SiO_2$) substrate S as shown in FIG. 2A, and a graphene layer G is formed on the metal shin film M by using chemical vapor deposition (CVD) method as shown in FIG. 2B. This process is formed at a temperature of about 1000° C. Nickel or copper breaks carbon bond so that a graphene single layer or graphene multi-layer is formed according to process condition.

Then, a PMMA layer P is formed on the graphene layer G through a spin coating method as shown in FIG. 2C, and the metal thin film M is corroded by using etchant so that the graphene layer G with the PMMA layer P is separated from the substrate S as shown in FIG. 2D.

Then, the graphene layer G that is separated from the substrate S is attached to the n-type semiconductor layer 133 and the PMMA layer P is removed as shown in FIG. 2E.

On the other hand, when light generated by the active layer 132 exits outside, a portion of the light is totally reflected and absorbed to induce light loss due to refractive index difference between air and the semiconductor material. In order to prevent total reflection, a roughness is formed on a top surface of the n-type semiconductor layer 133. However, when the roughness is formed on the top surface of the n-type semiconductor layer 133, the graphene layer G cannot strongly attached to the n-type semiconductor layer 133 when the graphene layer G is attached to the to the n-type semiconductor layer 133 through transferring method described above. When the graphene layer is directly formed on the n-type semiconductor layer 133 through CVD, high temperature process of about 1000° C. is required so that the semiconductor stacking structure 130 is damaged.

Therefore, other method is required in order to solve above problems.

SUMMARY OF THE INVENTION

The present invention provides a method of manufacturing a light generating device, which is capable of solving above problems.

The present invention also provides a light generating device manufactured by the above method.

The method of manufacturing a light generating device according to an exemplary embodiment of the present invention, includes preparing a semiconductor stacking structure including a p-type semiconductor layer, an n-type semiconductor layer and an active layer disposed between the p-type semiconductor layer and the n-type semiconductor layer; forming a metal thin film on the n-type semiconductor layer or on the p-type semiconductor layer; annealing the metal thin film to form a grain boundary at the metal thin film; applying liquid with graphite powder to the metal thin film with the grain boundary; thermally treating the semiconductor stacking structure to which the liquid with graphite powder is applied; and removing the metal thin film with the grain boundary.

For example, the metal thin film includes nickel (Ni) or copper (Cu).

For example, annealing the metal thin film to form a grain boundary at the metal thin film is performed by irradiating the metal thin film with laser.

For example, thermally treating the semiconductor stacking structure is performed in a temperature range of about 25° C. to about 260° C.

For example, the method may further include applying pressure to a surface of the semiconductor stacking structure having graphite powder on, when thermally treating the semiconductor stacking structure.

For example, removing the metal thin film with the grain boundary is performed by etchant.

For example, a surface of the n-type semiconductor layer or a surface of the p-type semiconductor layer, on which the metal thin film is formed, has roughness.

A light generating device according to an exemplary embodiment of the present invention includes a semiconductor stacking structure and a graphene layer. The semiconductor stacking structure includes a p-type semiconductor layer, an n-type semiconductor layer and an active layer disposed between the p-type semiconductor layer and the n-type semiconductor layer. The graphene layer is formed on the p-type semiconductor layer or the n-type semiconductor layer. A surface of the p-type semiconductor layer or a surface of the n-type semiconductor layer, on which the graphene layer is formed, has roughness.

For example, the graphene layer may have a surface contour that is substantially same as a surface contour of the roughness.

For example, the graphene layer may be directly grown on the surface of the p-type semiconductor layer or on the surface of the n-type semiconductor layer.

According to the method of manufacturing a light generating device of the present invention, the graphene layer can be formed on a surface of a semiconductor structure with roughness so that the limitation of the conventional method can be overcome.

Further, according to the light generating device manufactured through the above method, light efficiency is enhanced not only due to the graphene layer but also due to the roughness and current injecting efficiency is enhanced due to the graphene layer.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
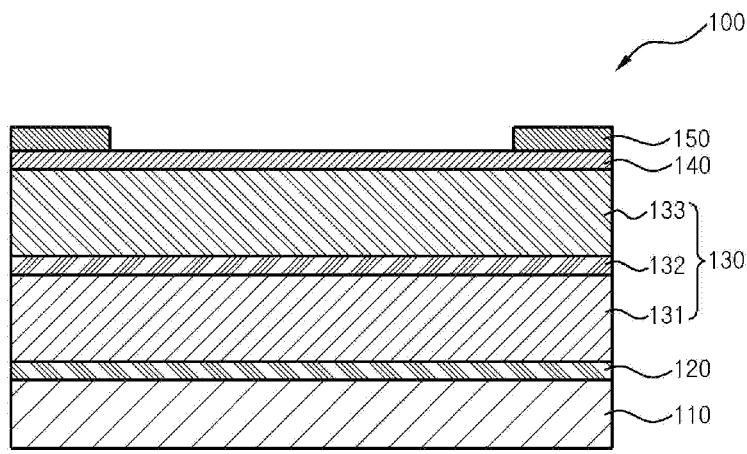
FIG. 1 is a cross-sectional view showing a conventional light generating device.
Figure 2A:
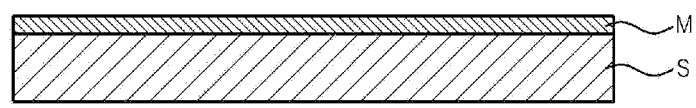
FIG. 2A through FIG. 2E are cross-sectional views showing a process of manufacturing the conventional light generating device in FIG. 1.
Figure 2B:
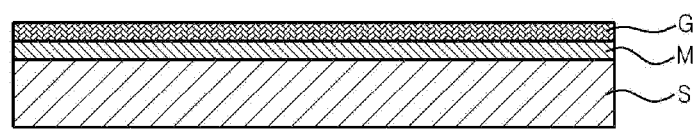
Figure 2C:
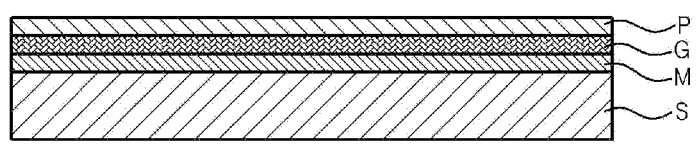
Figure 2D:
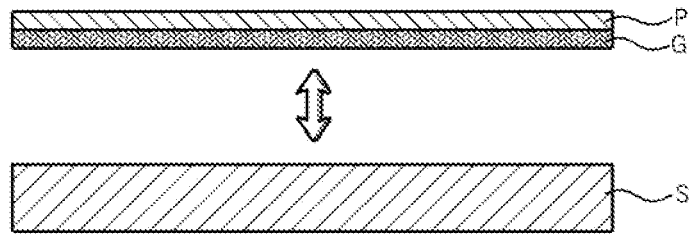
Figure 2E:
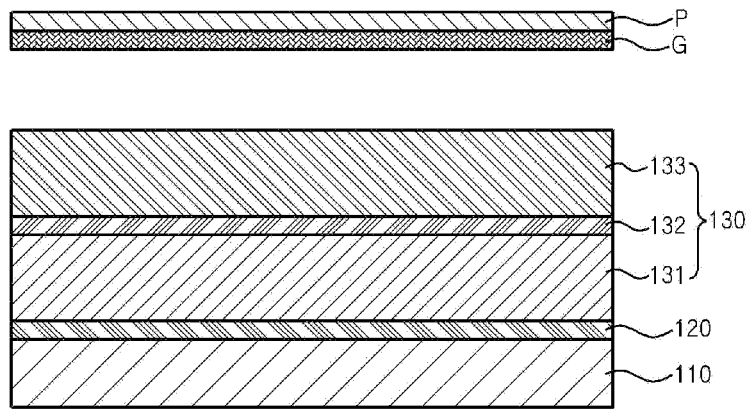

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

Hereinafter, exemplary embodiments of the present invention will be described in detail with reference to the accompanying drawings.

Figure 3:
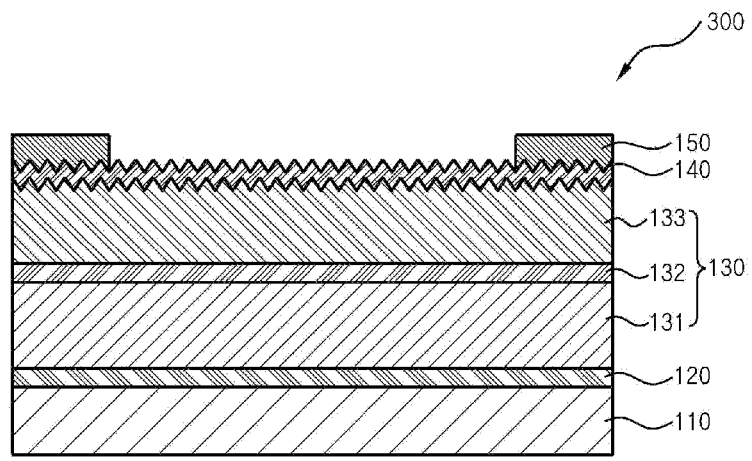
FIG. 3 is a cross-sectional view showing a light generating device manufactured by a method of manufacturing a light generating device according to an exemplary embodiment of the present invention.

FIG. 3 is a cross-sectional view showing a light generating device manufactured by a method of manufacturing a light generating device according to an exemplary embodiment of the present invention.

Referring to FIG. 3, a light generating device 300 according to an exemplary embodiment of the present invention includes a semiconductor stacking structure 130 and a graphene layer 140.

The semiconductor stacking structure 130 is formed on a p-type electrode 120 on the substrate 110 including metal. The semiconductor stacking structure 130 includes a p-type semiconductor layer 131, an n-type semiconductor layer 133 and an active layer 132 disposed between the p-type semiconductor layer 131 and the n-type semiconductor layer 133.

An n-type electrode 150 is formed on the graphene layer 140. A plurality of n-type electrodes 150 may be formed on the graphene layer 140.

The graphene layer 140 is formed on the n-type semiconductor layer 133. In this case, roughness is formed on a surface of the n-type semiconductor layer 133 on which the graphene layer 140 is formed. Therefore, the light generating device 300 is capable of enhancing light efficiency and current injecting efficiency due to the graphene layer 140.

Further, the graphene layer may be directly grown on the surface of the p-type semiconductor layer or on the surface of the n-type semiconductor layer, so that the graphene layer may have a surface contour that is substantially same as a surface contour of the roughness. That is because the graphene layer has so thin thickness and is formed on the surface with roughness.

Not shown in figures, the light generating device according to an embodiment of the present invention may be a lateral type having an n-type semiconductor layer formed on a substrate, an active layer formed on the n-type semiconductor layer, and a p-type semiconductor layer formed on the active layer. In this case, the roughness is formed on a top surface of the p-type semiconductor layer, and a graphene layer is formed on the p-type semiconductor layer.

The structure of the lateral type light generating device is well known to a person skilled in the art. Therefore, any further explanation will be omitted.

Figure 4:
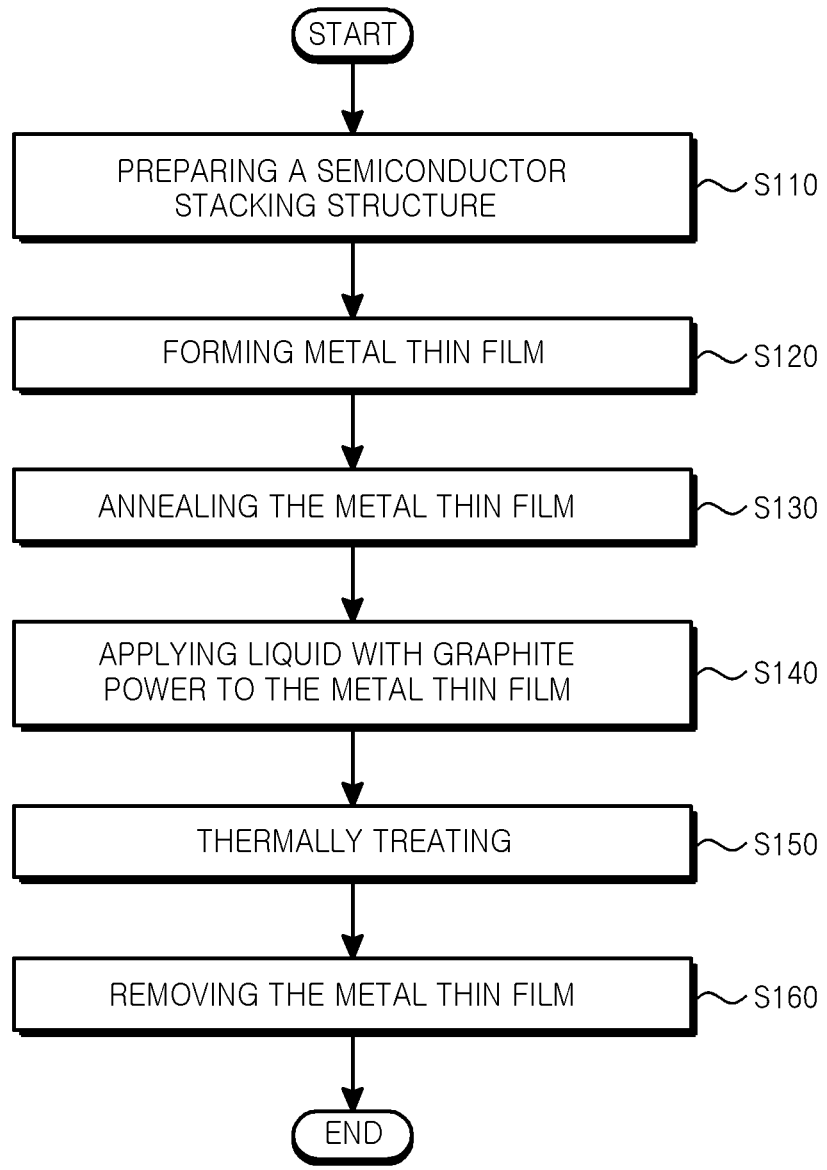
FIG. 4 is a flow chart showing a method of manufacturing a light generating device according to an exemplary embodiment of the present invention.

FIG. 4 is a flow chart showing a method of manufacturing a light generating device according to an exemplary embodiment of the present invention.

Hereinafter, the method of manufacturing the light generating device according to the present invention will be explained referring to FIG. 3 and FIG. 4.

According to a method of manufacturing a light generating device according to an exemplary embodiment of the present invention, a semiconductor stacking structure 130 including a p-type semiconductor layer 131, an n-type semiconductor layer 133 and an active layer 132 disposed between the p-type semiconductor layer 131 and the n-type semiconductor layer 133 is prepared (step S110). The semiconductor stacking structure 130 can be manufactured in a conventional method.

In detail, a semiconductor growing substrate (not shown) is prepared, and a nitride semiconductor with n-type dopants such as silicon (Si) is grown on the semiconductor growing substrate to form an n-type semiconductor layer 133.

Then, an active layer 132 is formed on the n-type semiconductor layer 133. For example, the active layer 132 may include nitride semiconductor. The active layer 132 may have, for example, a single well structure or a multi quantum well structure.

Then, nitride semiconductor with p-type dopants such as magnesium (Mg) is grown on the active layer 132 to form a p-type semiconductor layer 131.

Then, a p-type electrode 120 is formed on the p-type semiconductor layer 131. For example, the p-type electrode 120 may include an ohmic contact layer and a light reflecting layer. The ohmic contact layer may include an optically transparent and electrically conductive material such as ITO, and the light reflecting layer may include metal with high reflectivity such as silver (Ag), nickel (Ni), aluminum (Al), etc.

Then, a substrate 110 including metal is attached to the p-type electrode 120, and the semiconductor growing substrate (not shown) is separated. In order to separate the semiconductor growing substrate (not shown), a physical process or a chemical etching process may be used. Alternatively, a laser may be used.

Additionally, before separating the semiconductor growing substrate (not shown), roughness may be formed on the top surface of the n-type semiconductor layer. In order for that, a thin metal is deposited on the n-type semiconductor layer 133, dots with hundreds of nano size are formed through an annealing process, the roughness is formed through ICP, and remaining thin metal is removed. Through the above process, the roughness may be formed on the surface of the n-type semiconductor layer 133.

Then, a metal thin film is formed on the n-type semiconductor layer 133 (step S120) as shown in FIG. 3. The metal thin film may be formed through e-beam or sputtering. For example, the metal thin film may include nickel (Ni) or copper (Cu). Nickel (Ni) and copper (Cu) breaks carbon bond which is to be applied to form a single layer or multi-layer graphene.

Then, the metal thin film undergoes annealing process to generate grain boundary at the metal thin film (step S130). In detail, in order to generate the grain boundary at the metal thin film, the metal thin film is irradiated by a laser.

When the metal thin film is irradiated by a laser, the grain boundary is formed at the metal thin film as a rice paddy cracked from a long drought.

Then, a liquid including graphite powder is applied to the metal thin film with the grain boundary (step S140).

Then, the semiconductor stacking structure with the liquid including graphite powder is thermally treated (step S150). This thermal treatment may be performed at a temperature of about 25° C. to about 260° C. In this thermal treatment, a pressure may be applied to the surface of the semiconductor stacking structure 130 with graphite powder. When pressure is applied to the surface of the semiconductor stacking structure 130, the graphite powder may more easily permeate through the grain boundary.

Then, the metal thin film with the grain boundary is removed (step S160). For example, the metal thin film may be removed through etchant.

Hereinbefore, a method of manufacturing a light generating device that is a vertical type was explained for example. However, it is obvious to a person skilled in the art that the above explained method may be applied to a method of manufacturing a light generating device that is a lateral type.

That is, a semiconductor growing substrate (not shown) is prepared, and a nitride semiconductor with n-type dopants such as silicon (Si) is grown on the semiconductor growing substrate to form an n-type semiconductor layer.

Then, an active layer is formed on the n-type semiconductor layer 133.

Then, nitride semiconductor with p-type dopants such as magnesium (Mg) is grown on the active layer to form a p-type semiconductor layer. Then, a portion of the p-type semiconductor layer and the active layer is removed to expose a portion of the n-type semiconductor layer. In this case, roughness is formed on the surface of the p-type semiconductor layer, and a metal thin film is formed on the surface of the p-type semiconductor layer. Then, the processes from step S120 to step S160 may be performed.

FIG. 5A through FIG. 5D are conceptual view showing a process of generating a graphene layer through a metal thin film with grain boundaries.

Figure 5A:
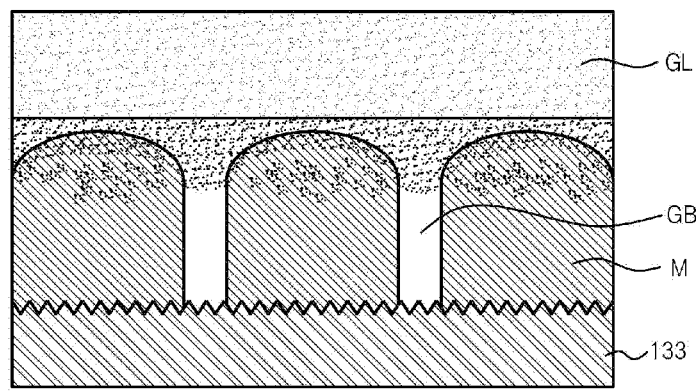
FIG. 5A through FIG. 5D are conceptual view showing a process of generating a graphene layer through a metal thin film with grain boundaries.

Referring to FIG. 5A, the metal thin film M is formed on the n-type semiconductor layer 133, and the metal thin film has the grain boundary GB formed through laser annealing. Additionally, the liquid GL with graphite powder covers the metal thin film M.

Figure 5B:
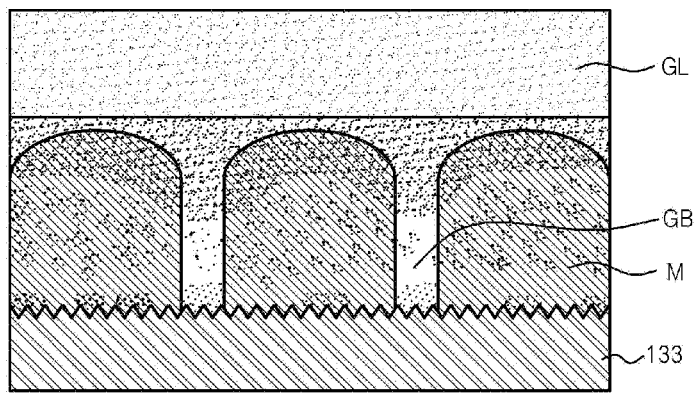
Figure 5C:
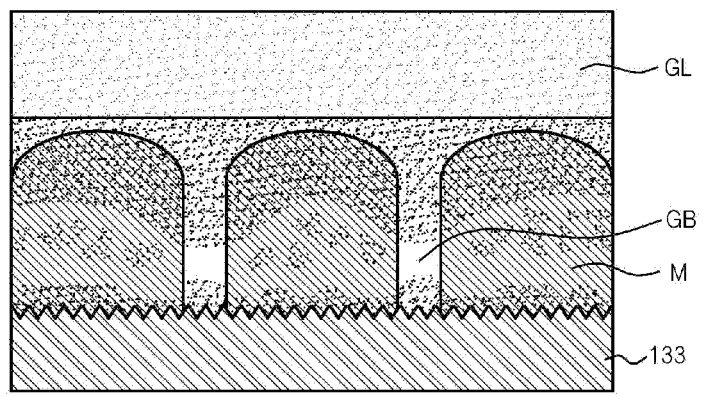
Figure 5D:
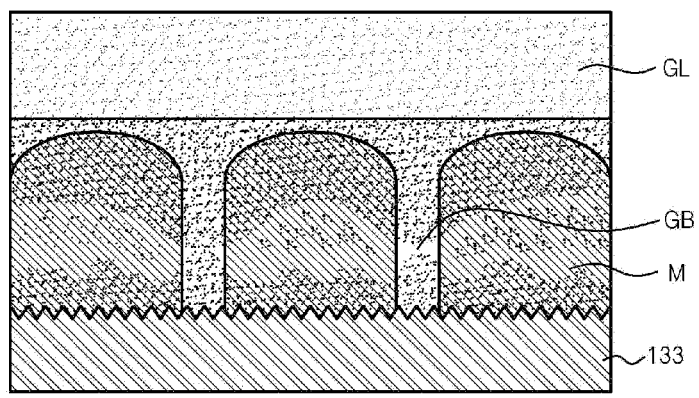

Then, as shown in FIGS. 5B through 5D, through the thermal treatment with pressure applied to the surface of the semiconductor stacking structure 130, the graphite powder permeates through the grain boundary GB to form a single layered or multi-layered graphene on the n-type semiconductor layer 133.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a light generating device, comprising:
    preparing a semiconductor stacking structure including a p-type semiconductor layer, an n-type semiconductor layer and an active layer disposed between the p-type semiconductor layer and the n-type semiconductor layer;
    forming a metal thin film on the n-type semiconductor layer or on the p-type semiconductor layer;
    annealing the metal thin film to form a grain boundary at the metal thin film;
    applying liquid with graphite powder to the metal thin film with the grain boundary;
    thermally treating the semiconductor stacking structure to which the liquid with graphite powder is applied; and
    removing the metal thin film with the grain boundary.

2. The method of claim 1, wherein the metal thin film comprises nickel (Ni) or copper (Cu).

3. The method of claim 1, wherein annealing the metal thin film to form a grain boundary at the metal thin film is performed by irradiating the metal thin film with laser.

4. The method of claim 1, wherein thermally treating the semiconductor stacking structure is performed in a temperature range of about 25° C. to about 260° C.

5. The method of claim 4, further comprising applying pressure to a surface of the semiconductor stacking structure having graphite powder on, when thermally treating the semiconductor stacking structure.

6. The method of claim 1, wherein removing the metal thin film with the grain boundary is performed by etchant.

7. The method of claim 1, wherein a surface of the n-type semiconductor layer or a surface of the p-type semiconductor layer, on which the metal thin film is formed, has roughness.

* * * * *